(12) United States Patent
Best et al.

(10) Patent No.: US 11,329,010 B2
(45) Date of Patent: May 10, 2022

(54) INTEGRATED CIRCUIT SHIELD

(71) Applicant: Cryptography Research, Inc, Sunnyvale, CA (US)

(72) Inventors: Scott C. Best, Palo Alto, CA (US); Ming Li, Fremont, CA (US); Gary B. Bronner, Los Altos, CA (US); Mark Evan Marson, Carlsbad, CA (US)

(73) Assignee: Cryptography Research, Inc., San Francisco, CA (US)

( * ) Notice: Subject to any disclaimer, the term of this patent is extended or adjusted under 35 U.S.C. 154(b) by 0 days.

(21) Appl. No.: 16/838,577

(22) Filed: Apr. 2, 2020

(65) Prior Publication Data

US 2020/0328163 A1    Oct. 15, 2020

Related U.S. Application Data

(60) Provisional application No. 62/908,257, filed on Sep. 30, 2019, provisional application No. 62/832,674, filed on Apr. 11, 2019.

(51) Int. Cl.
*H01L 23/00*    (2006.01)

(52) U.S. Cl.
CPC ............ *H01L 23/573* (2013.01); *H01L 24/32* (2013.01); *H01L 24/73* (2013.01); *H01L 2224/32145* (2013.01); *H01L 2224/73215* (2013.01); *H01L 2224/73253* (2013.01)

(58) Field of Classification Search
CPC ............................ H01L 25/0657; H01L 23/57
See application file for complete search history.

(56) References Cited

U.S. PATENT DOCUMENTS

| | | | |
|---|---|---|---|
| 6,403,882 B1 | 6/2002 | Chen et al. | |
| 8,074,082 B2 | 12/2011 | Ozguz et al. | |
| 8,664,047 B2 | 3/2014 | Lower et al. | |
| 2016/0155679 A1* | 6/2016 | Davies ................. | H01L 23/576 257/693 |

* cited by examiner

*Primary Examiner* — Yu-Hsi D Sun
(74) *Attorney, Agent, or Firm* — The Neudeck Law Firm, LLC (57) ABSTRACT

An anti-tamper layer is applied to a blank wafer. The layered wafer is then diced into shield dies. A shield die is oxide-to-oxide bonded to the top of an active die such that removing the shield die will damage the active die. The shield die may be sized and positioned such that wirebond pads along one or more edges of the active die remain exposed. The exposed wirebond pads may be used to electrically connect, via wirebonds, the active die to a substrate. A second shield die may be attached to the bottom of the active die to help protect against the use of bottom-to-top delayering.

15 Claims, 12 Drawing Sheets

INTEGRATED CIRCUIT SHIELD

DETAILED DESCRIPTION OF THE EMBODIMENTS

To clone or extract secret information (e.g., encryption keys) from an integrated circuit, an adversary may elect to reverse engineer the netlist. A way to reverse engineer the netlist is to delayer the die while taking high-resolution images at various stages of the delayering process. Software is then used to process these images into the chip physical layout and the physical layout is processed into a netlist.

In an embodiment, an anti-tamper layer is applied to a blank wafer. The layered wafer is then diced into shield dies. A shield die is bonded to the top of an active die such that removing the shield die will damage the active die. The shield die may be sized and positioned such that input/output pads (i.e., pads used for input signals, output signals, bidirectional signaling, power supplies, etc.—hereinafter I/O pads) along one or more edges of the active die remain exposed. These I/O pads may be, for example, intended to have a wirebond attached thereto. The exposed I/O pads may be used to electrically connect, e.g. via wirebonds, the active die to a substrate. In an embodiment, a second shield die may be attached to the bottom of the active die to help protect against the use of bottom-to-top delayering or other invasive attacks.

Figure 1A:
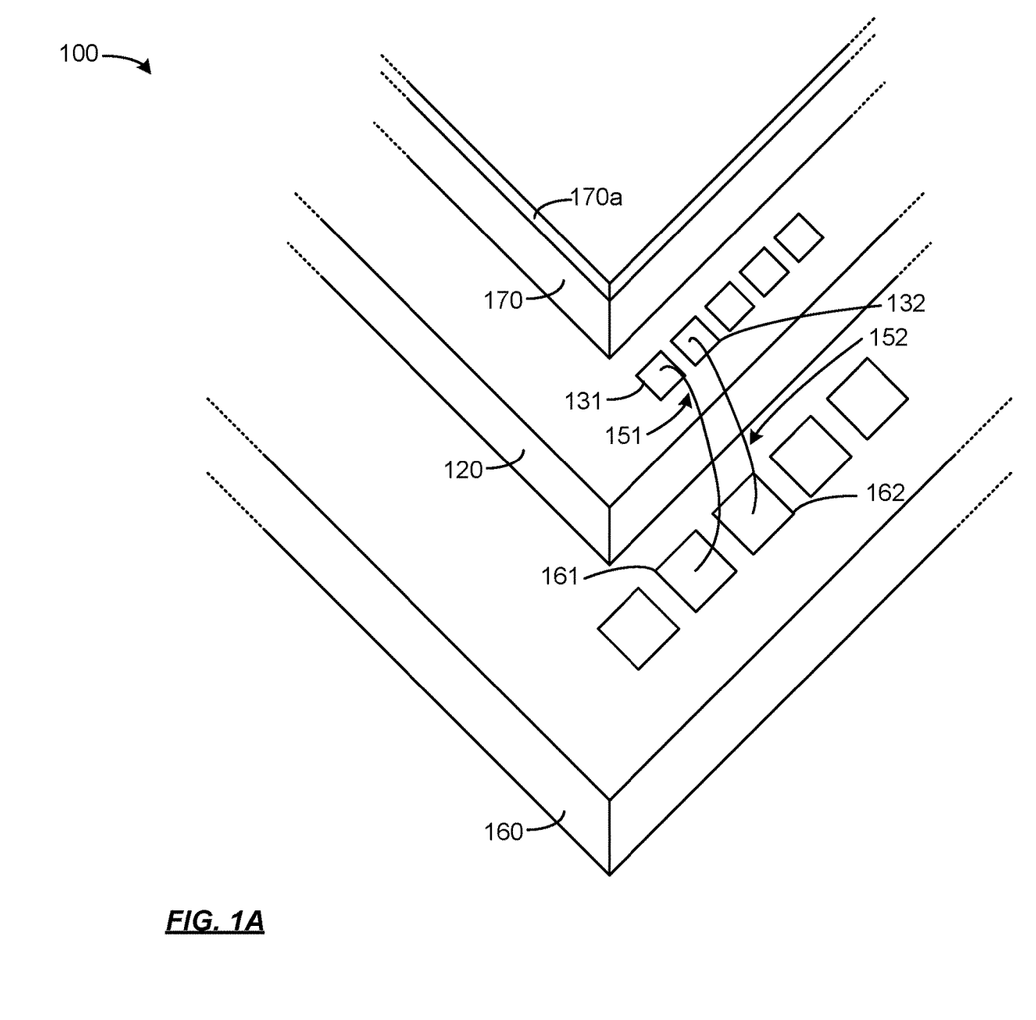
FIG. 1A is a perspective view illustration of anti-tamper integrated circuit assembly.
Figure 1B:
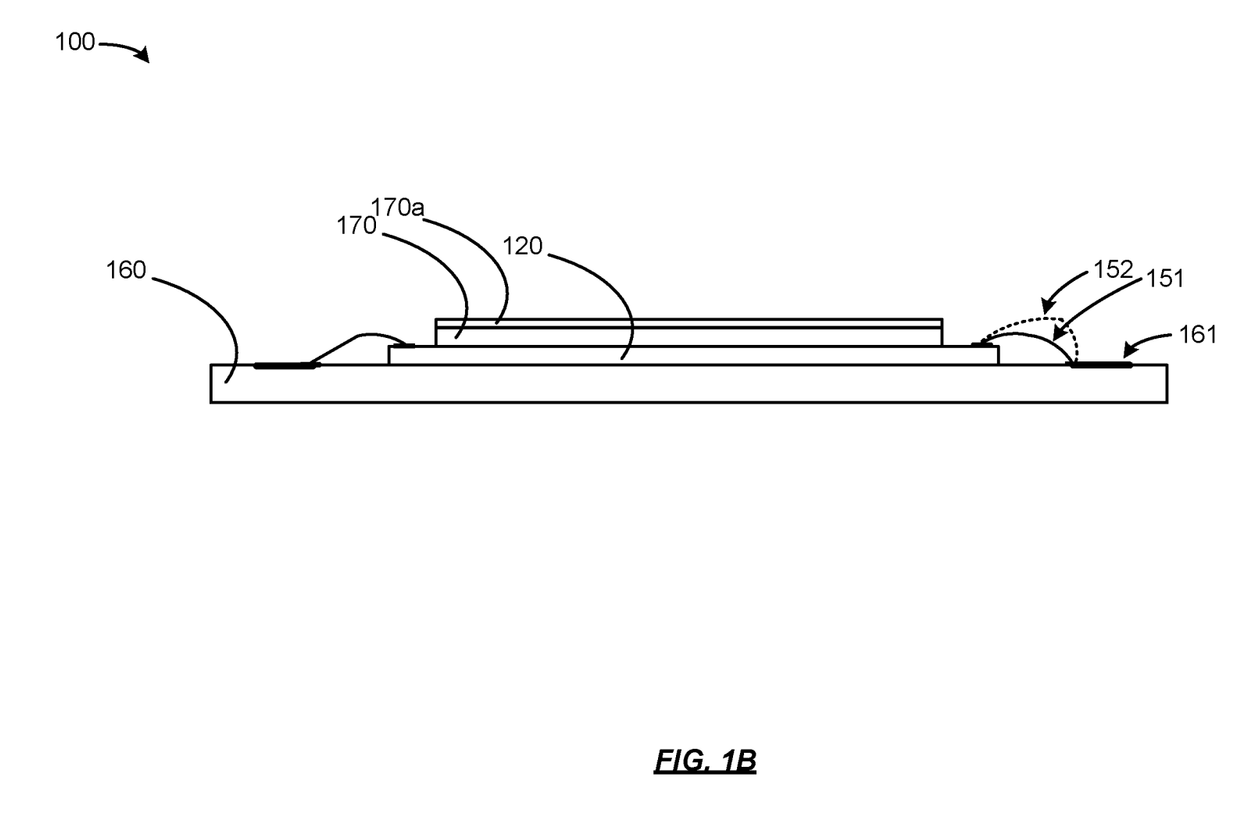
FIG. 1B is a side view illustration of an anti-tamper integrated circuit assembly.

FIG. 1A is a perspective view illustration of anti-tamper integrated circuit assembly. FIG. 1B is a side view illustration of an anti-tamper integrated circuit assembly. In FIGS. 1A and 1B, assembly 100 comprises active integrated circuit die 120, packaging substrate 160, shield die 170, and wire bonds 151-152. Active die 120 includes wirebond pads 131-132. Substrate 160 includes wirebond pads 161-162. Shield die 170 includes anti-tamper layer 170a.

In FIGS. 1A and 1B, active die 120 is packaged on top of substrate 160. Shield die 170 is packaged on top of active die 120. In an embodiment, shield die 170 is dimensioned and positioned to expose the bonding pads 131-132 of active die 120 so bonding wires (or other types of interconnect) may be connected to active die 120. In an embodiment, bonding wires 151-152 respectively connect the wirebond pads 131-132 of active die 120 to the wirebond pads 161-162 of substrate 160.

Shield die 170 may be packaged (bonded) to active die 120 such that the backside (bottom) oxide of shield die 170 becomes chemically bonded (e.g., oxide-to-oxide) to the topmost layer of active die 120. Shield die 170 may be packaged (bonded) to active die 120 using a bonding process that does not require processing temperatures that may damage the active circuitry of active die 120 (e.g., high temperature annealing that is greater than 170° C.). For example, shield die 170 may be bonded to active die 120 by one or more processes described in U.S. Pat. No. 6,902,987 to Tong et al., titled "METHOD FOR LOW TEMPERATURE BONDING AND BONDED STRUCTURE", which is hereby incorporated herein by reference, for all purposes. Once a bond is formed between the bottom of shield die 170 and the top (active side) of active die 120, removal of shield die 170 without damaging the active circuitry of active die 120 can be difficult or even impossible.

In an embodiment, anti-tamper layer 170a of shield die 170 comprises a hard (relative to Si or $SiO_2$) material. Anti-tamper layer 170a may be, for example, boron-nitride, micro-crystalline diamond, nano-crystalline diamond, diamond like carbon (DLC), etc. In an embodiment, anti-tamper layer 170a may not be removed, melted, dissolved, etc. without using a process that would damage at least a portion of the active layers of active die 120. For example, the process to apply and/or remove anti-tamper layer 170a may use temperatures in excess of 350° C. However, the active circuitry of die 120 may comprise one or more materials (e.g., copper) that would be damaged by those temperatures. Thus, removing anti-tamper layer 170a from shield die 170 without also damaging the active circuitry of die 120 is difficult or impossible.

Figure 2:
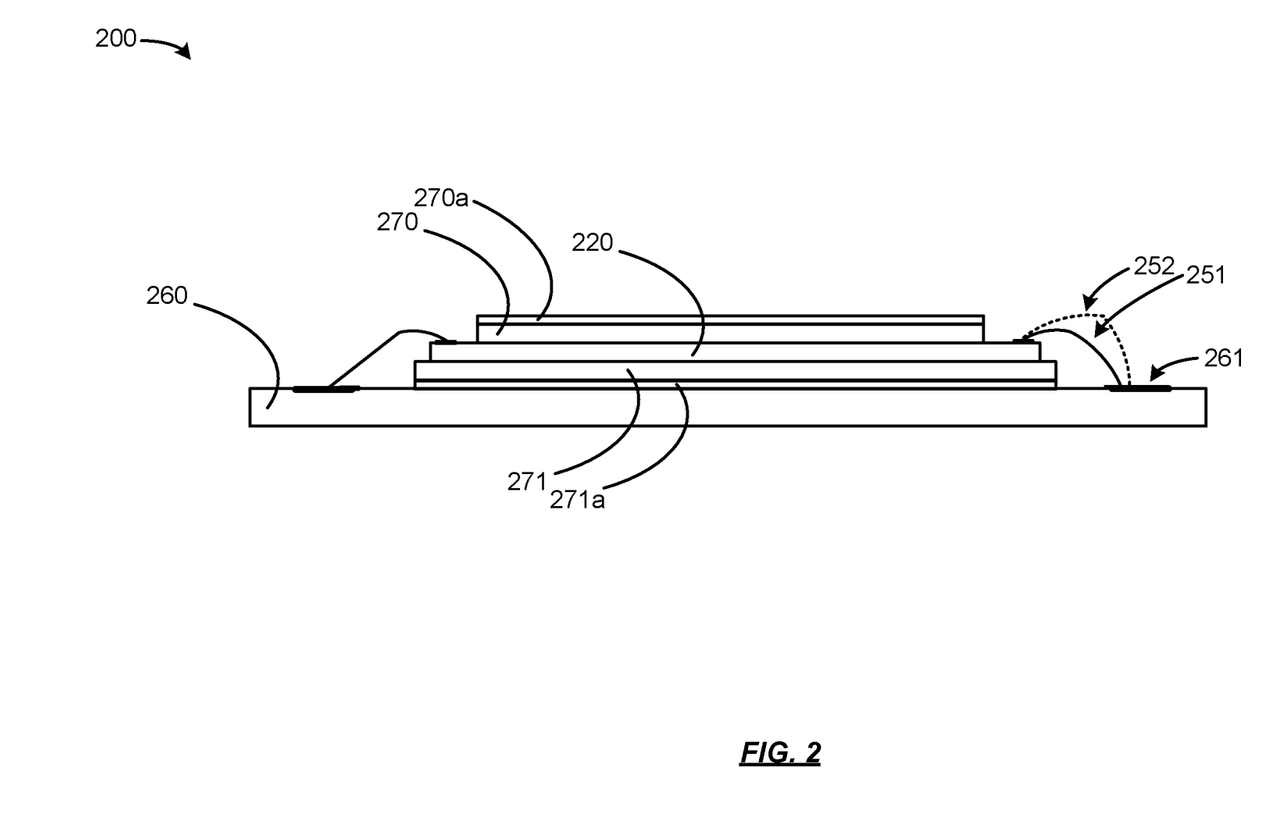
FIG. 2 is a side view illustration of an assembly that anti-tamper shields two sides of an integrated circuit.

FIG. 2 is a side view illustration of an assembly that anti-tamper shields two sides of an integrated circuit. In FIG. 2, assembly 200 comprises active integrated circuit die 220, packaging substrate 260, top shield die 270, bottom shield die 271, and wire bonds 251-252. Active die 220 includes I/O pads such as wirebond pads (not shown in FIG. 2.) Substrate 260 includes substrate pads 261-262. Top shield die 270 includes anti-tamper layer 270a. Bottom shield die 271 includes anti-tamper layer 271a.

In FIG. 2, bottom shield die 271 is packaged on top of substrate 260. Active die 220 is packaged on top of shield die 271. Shield die 270 is packaged on top of active die 220. In an embodiment, shield die 270 is dimensioned and positioned to expose the bonding pads of active die 120 so bonding wires may be connected to active die 220. In an embodiment, bonding wires 251-252 respectively connect the wirebond pads of active die 120 to the substrate pads (e.g., 261) of substrate 260.

Top shield die 270 may be packaged (bonded) to active die 220 such that the backside (bottom) of top shield die 270 becomes chemically bonded (e.g., oxide-to-oxide) to the topmost layer of active die 220. Top shield die 270 may be packaged (bonded) to active die 220 using a bonding process that does not require processing temperatures that may damage the active circuitry of active die 220 (e.g., high temperature annealing that is greater than 170° C.) For example, top shield die 270 may be bonded to active die 220 by one or more processes described in U.S. Pat. No. 6,902,987 to Tong et al., titled "METHOD FOR LOW TEMPERATURE BONDING AND BONDED STRUCTURE". Once a bond is formed between the bottom oxide of shield die 270 and the top (active side) side of active die 220, removal of shield die 270 without damaging the active circuitry of active die 220 can be difficult or even impossible.

Bottom shield die 271 may be packaged (bonded) to active die 220 such that the bottom (i.e., opposite from anti-tamper layer 271a) of bottom shield die 271 becomes chemically bonded (e.g., oxide-to-oxide) to the bottom layer of active die 220. In an embodiment, active die 220 is thinned before being attached to bottom shield die 271. Note that while the top shield die 217 may require die-to-wafer bonding (i.e., while active die 220 is still in wafer form), a wafer of bottom shield die 271 may be bonded to the active wafer using a more economical wafer-to-wafer bonding process. Note also that if the active wafer uses a flip-chip style of interconnect rather than wirebond attachment, an embodiment utilizing wafer-to-wafer bonding of the bottom shield die 271 to the bottom layer of thinned active die 220 may be sufficient to achieve most of the anti-tamper benefits described herein (being that the underfill material of flip-chip interconnect can be chosen to fortify the chip's anti-tamper properties).

Bottom shield die 271 may be packaged (bonded) to active die 220 using a bonding process that does not require processing temperatures that may damage the active circuitry of active die 220 (e.g., high temperature annealing that is greater than 170° C.) For example, bottom shield die 270 may be bonded to active die 220 by one or more processes described in U.S. Pat. No. 6,902,987 to Tong et al., titled "METHOD FOR LOW TEMPERATURE BONDING AND BONDED STRUCTURE". Once a bond is formed between the bottom oxide of shield die 270 (i.e., opposite from anti-tamper layer 271a) and the bottom (i.e., non-active) side of active die 220, it is more difficult to delayer active die 220.

Figure 3A:
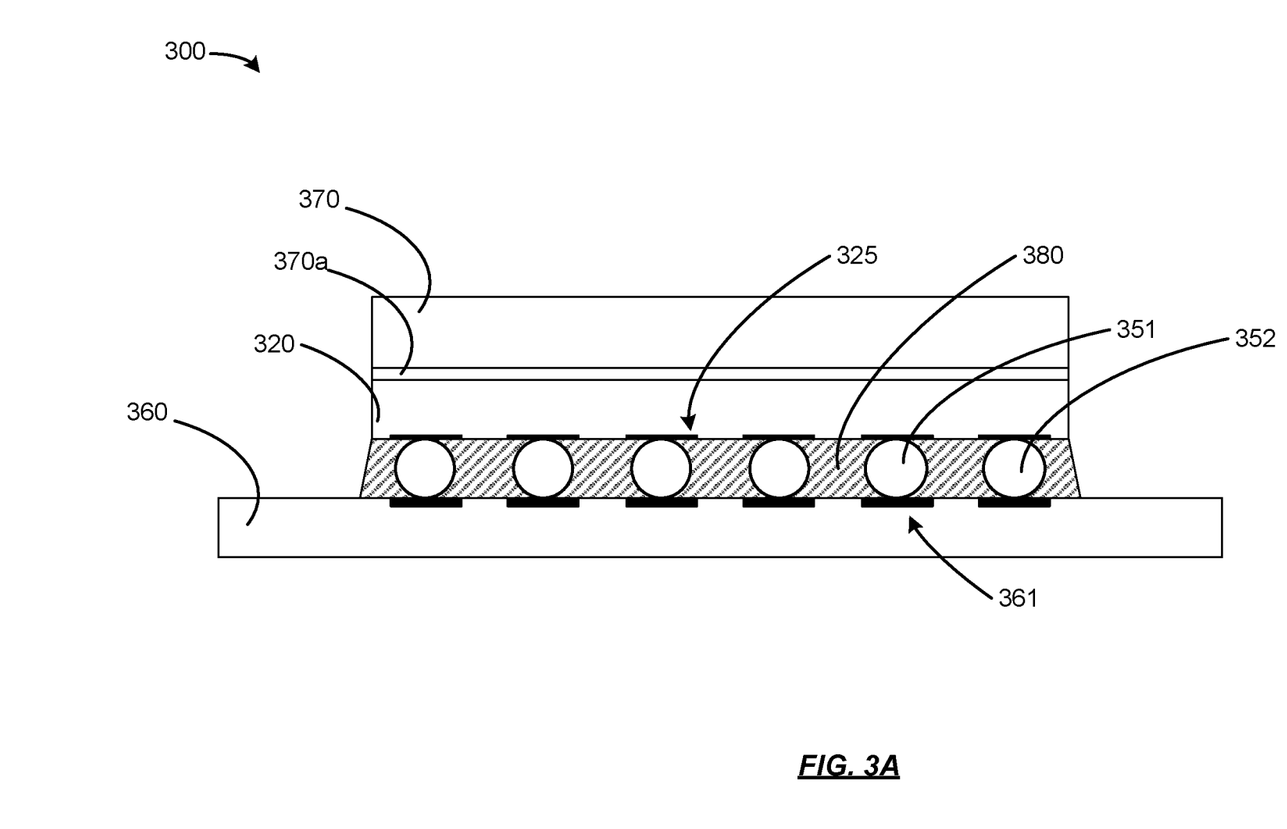
FIG. 3A is a side view illustration of an assembly that anti-tamper shields two sides of flip-chip mounted integrated circuit.

FIG. 3A is a side view illustration of an assembly that anti-tamper shields two sides of flip-chip mounted integrated circuit. In FIG. 3A, assembly 300 comprises active integrated circuit die 320, packaging substrate 360, shield die 370, solder bumps 351-352, and underfill material 380. Active die 320 includes I/O pads such as solder bump pads (also generally referred to as "C4 pads") 325. Substrate 360 includes substrate pads such as substrate pad 361. Shield die 370 includes anti-tamper layer 370a. Note that in other flip-chip embodiments, solder bumps are replaced with other area-array first-layer interconnect technology, such as so-called "copper pillars".

In FIG. 3A, shield die 370 is packaged on top of active die 320. In an embodiment, solder bumps 351-352 respectively connect the solder bump pads of active die 320 to the substrate pads (e.g., 361) of substrate 360. Shield die 370 may be packaged (bonded) to active die 320 such that the anti-tamper layer 370a of shield die 370 becomes chemically bonded to the backside of active die 320. Note that to accommodate this bonding, an additional layer of material (e.g., spin-on-glass, silicon dioxide, etc.) may be grown or deposited on top of anti-tamper later 370a. In an embodiment, active die 320 is thinned while attached to a support wafer before being bonded to shield die 370. Shield die 370 may be packaged (bonded) to active die 320 using a bonding process that does not require processing temperatures that may damage the active circuitry of active die 320 (e.g., high temperature annealing that is greater than 170° C.) For example, shield die 370 may be bonded to active die 320 by one or more processes described in U.S. Pat. No. 6,902,987 to Tong et al., titled "METHOD FOR LOW TEMPERATURE BONDING AND BONDED STRUCTURE". Once a bond is formed between the anti-tamper layer 370a of shield die 370 and the backside (non-active side) of active die 320, removal of shield die 370 without damaging the active circuitry of active die 320 can be difficult or even impossible (especially if active die 320 was thinned prior to bonding).

Note that the active die 320 uses a flip-chip style of interconnect with substrate 360 (rather than wirebond attachment). Thus, in an embodiment the underfill material 380 of assembly 300 can be chosen to fortify the chip's anti-tamper properties. In other words, underfill 380 may be selected to increase the likelihood of damaging the active circuitry from the front side direction of active die 320 when active die 320 is removed from substrate 360. Anti-tamper layer 370a increases the likelihood of damaging the active circuitry from the back side direction of active die 320 when shield die 370 is removed from active die 320. In an embodiment, active die 320 may also be thinned while attached to a support wafer before being bonded to an anti-tamper wafer.

Figure 3B:
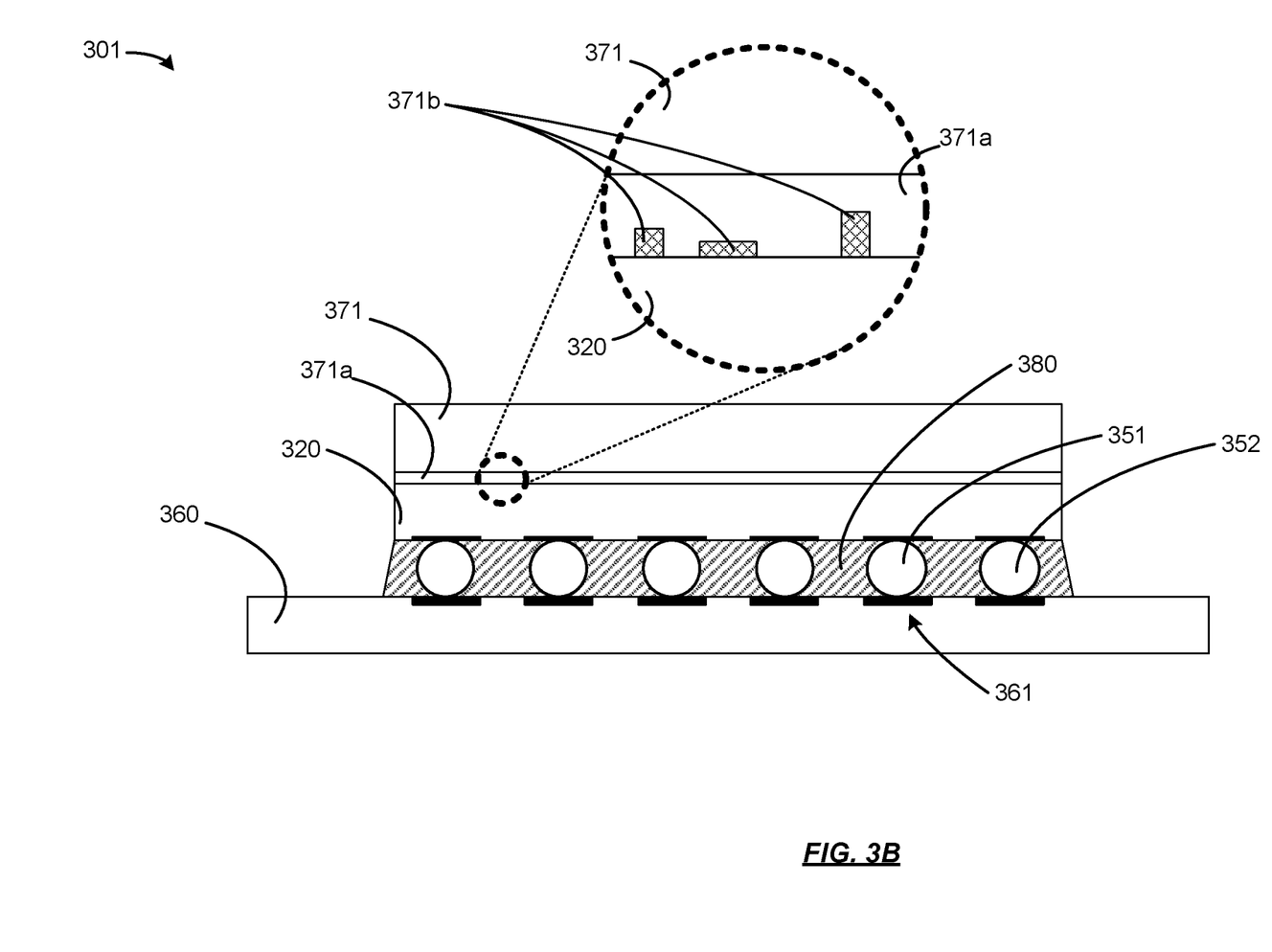
FIG. 3B is a magnified illustration of random imperfections on an anti-tamper shield layer.

FIG. 3B is a magnified illustration of random imperfections on an anti-tamper shield layer. In FIG. 3B, assembly 301 comprises active integrated circuit die 320, packaging substrate 360, shield die 371, solder bumps 351-352, and underfill material 380. Shield die 371 includes anti-tamper layer 371a that has been patterned with random imperfections 371b. In an embodiment, the bonding-side of anti-tamper layer 371a may be patterned prior to shield die 371 being attached to active die 320. In FIG. 3B, the surface of anti-tamper layer 371a that is bonded to active die 320 includes random (or alternately, non-random) imperfections 371b. These imperfections 371b may be produced by, for example, random pock-marking the anti-tamper layer 371a with a laser. The non-uniformity created by this patterning of the anti-tamper layer surface may complicate the removal of the anti-tamper layer during an invasive attack.

Figure 4A:
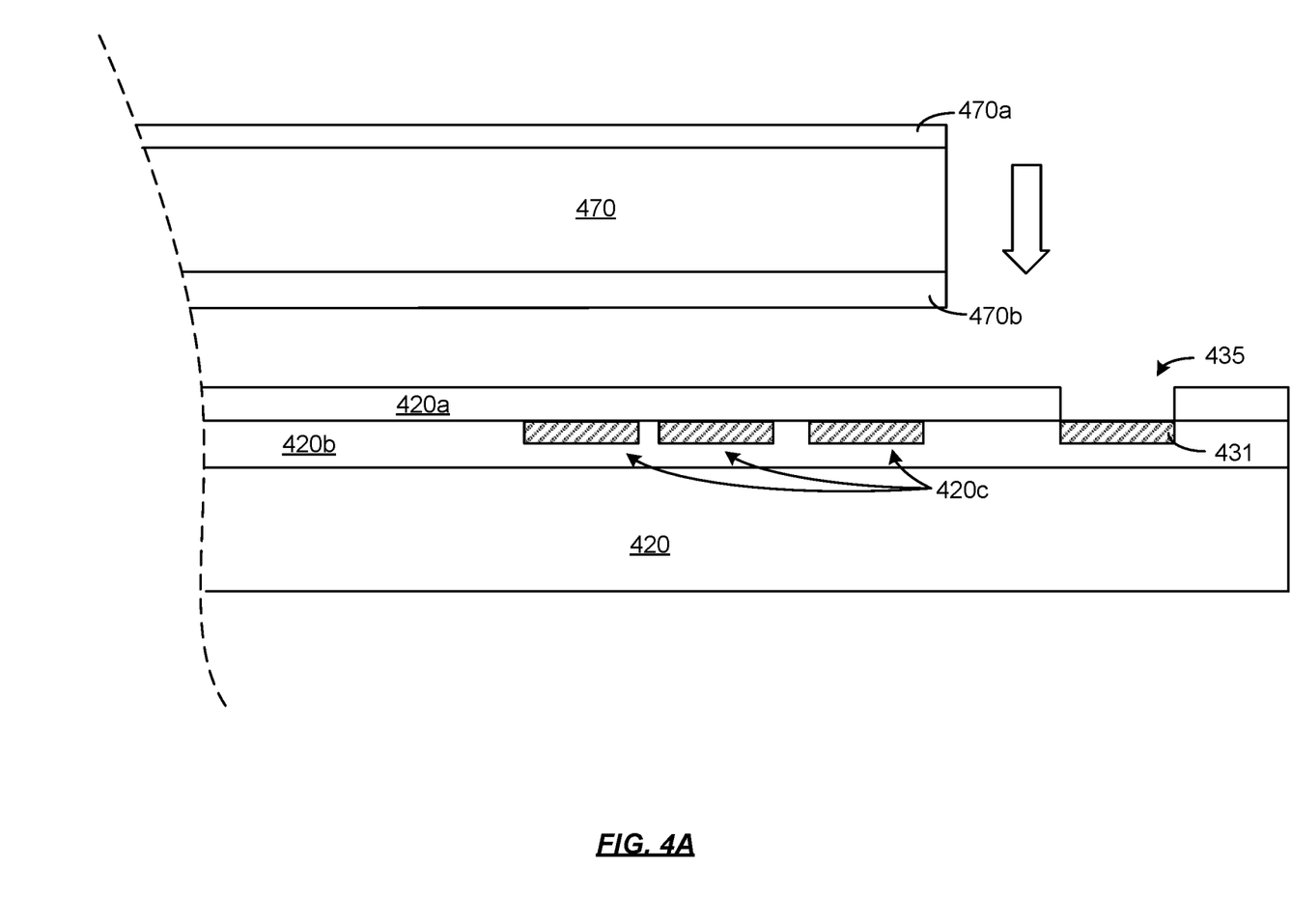
FIG. 4A illustrates an anti-tamper shield die being applied to an integrated circuit.
Figure 4B:
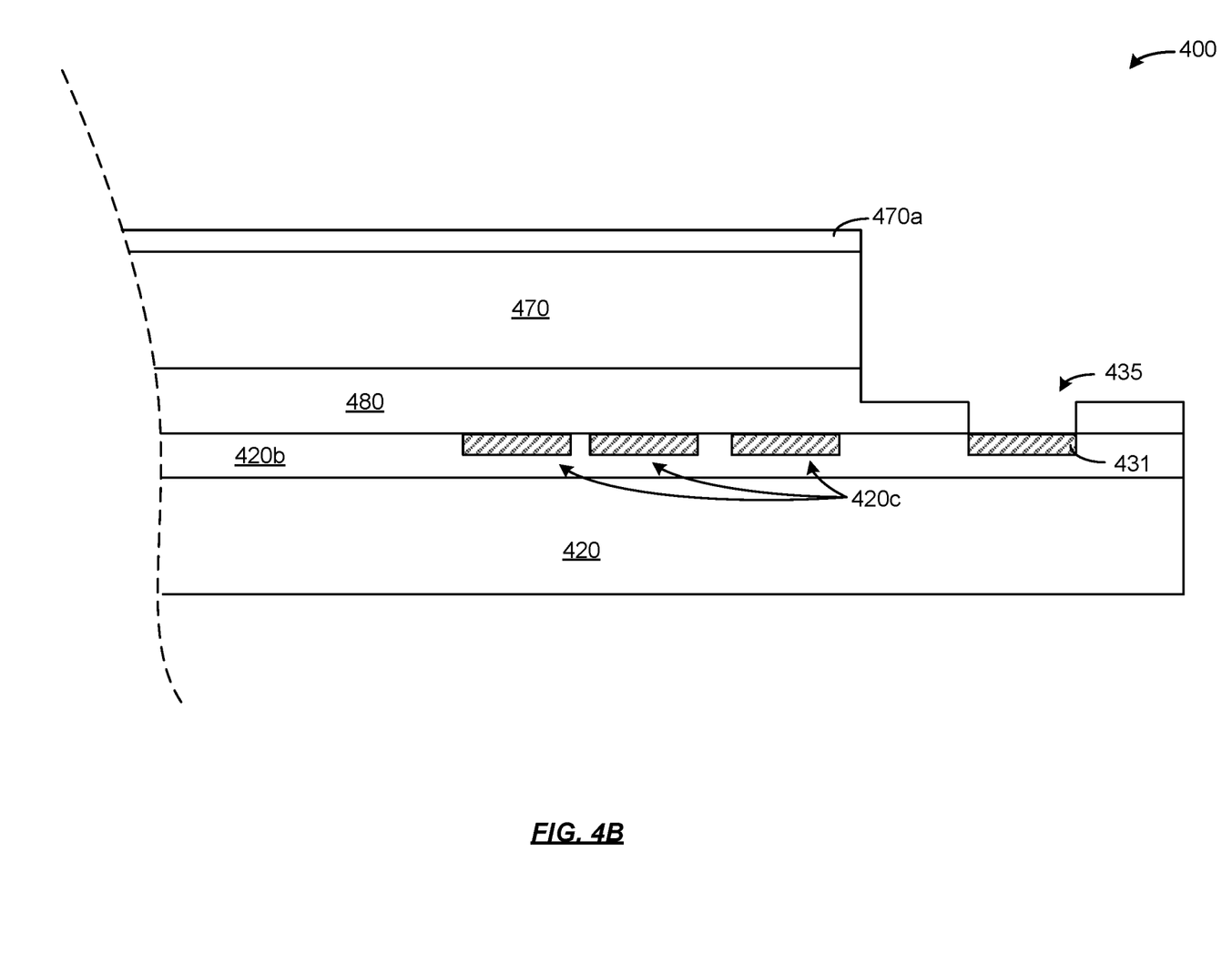
FIG. 4B illustrates an anti-tamper shield die bonded to an integrated circuit.
Figure 4C:
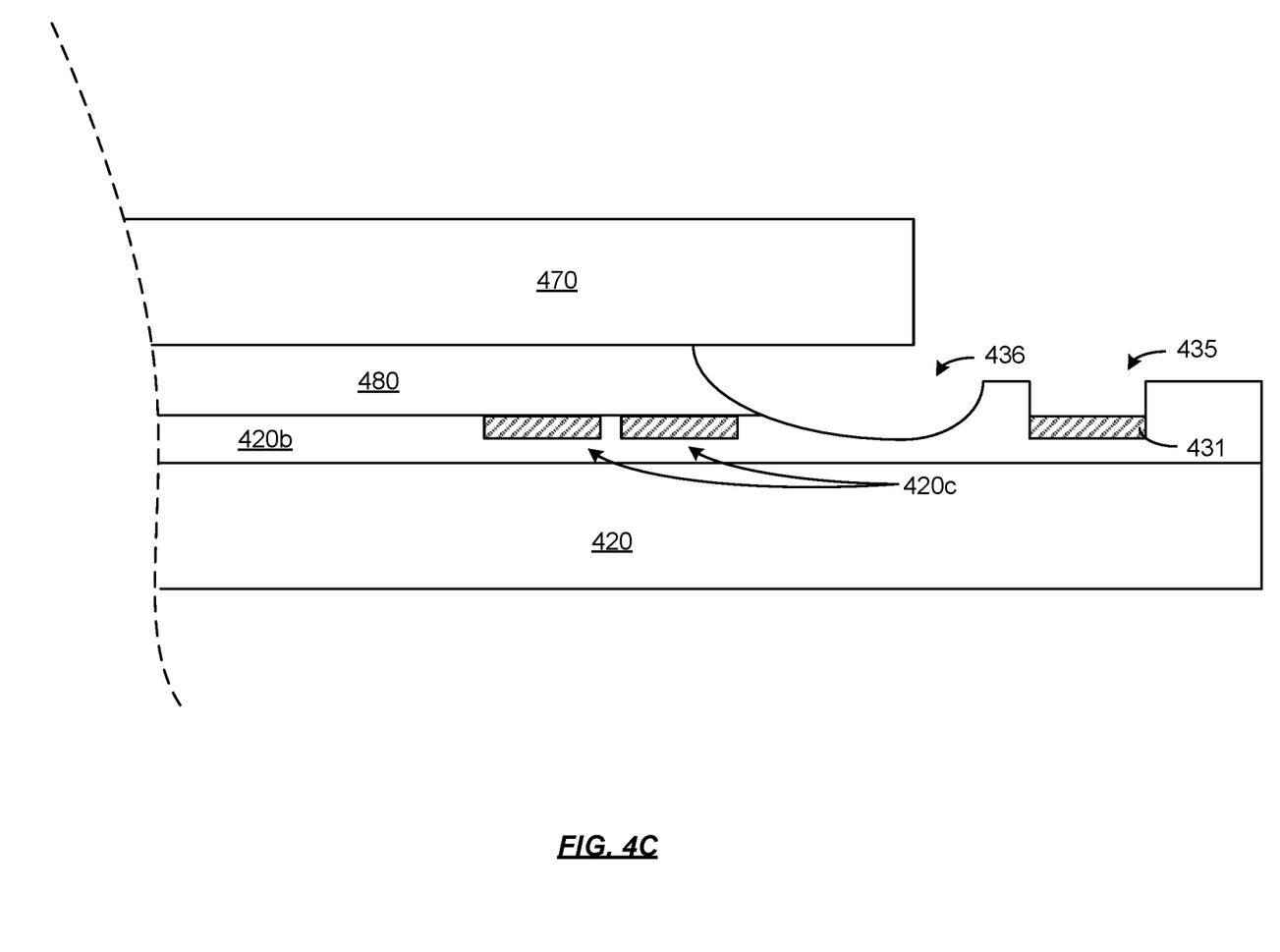
FIG. 4C illustrates an example attempt to delayer an anti-tamper shielded integrated circuit assembly.

FIG. 4A illustrates an anti-tamper shield die being applied to an integrated circuit. FIG. 4B illustrates an anti-tamper shield die bonded to an integrated circuit. FIG. 4C illustrates an example attempt to delayer an anti-tamper shielded integrated circuit assembly. In FIGS. 4A-4C shield die 470 includes anti-tamper layer 470a and bottom oxide layer 470b. Active die 420 includes top oxide layer 420a and active circuitry 420b. Top oxide layer 420a includes passivation opening 435 that exposes I/O pad 431. Active circuitry 420b includes patterned metal 420c. In an embodiment, patterned metal 420c may comprise an anti-tamper metallization pattern coupled to anti-tamper circuitry that detects whether the anti-tamper metallization pattern has been disturbed.

FIG. 4A illustrates an anti-tamper shield die being applied to an integrated circuit. In FIG. 4A, shield die 470 is separate from active die 420. Top oxide layer 420a of active die 420 and bottom oxide layer 470b of shield die 470 are opposite each other and close to coming in contact.

FIG. 4B illustrates an anti-tamper shield die bonded to an integrated circuit. In FIG. 4B, shield die 470 has been bonded to active die 420. Shield die 470 has been bonded to active die 420 such that the backside (bottom) oxide 470b of shield die 470 has become chemically bonded (e.g., oxide-to-oxide) to the top oxide layer 420a of active die 420 thereby forming a merged oxide layer 480. Shield die 470 has been bonded to active die 420 such that passivation opening 435 is not covered by shield die 470. Thus, I/O pad 431 remains exposed after shield die 470 has been bonded to active die 420. I/O pad 431 may therefore be used to electrically connect active die 420 to other integrated circuits (e.g., via a substrate, printed circuit board, etc.)

FIG. 4C illustrates an example attempt to delayer an anti-tamper shielded integrated circuit assembly. In FIG. 4C, anti-tamper layer 470a has been removed (e.g., by chemical etching.) However, the harsh requirements (e.g., temperature, acidity, chemical reactions, etc.) required to remove anti-tamper layer remove a portion 436 of active layer 420b, layer 480, and patterned metal 420c. In particular, for example, a part of an anti-tampering metallization pattern that is part of patterned metal 420c may be removed.

Figure 5:
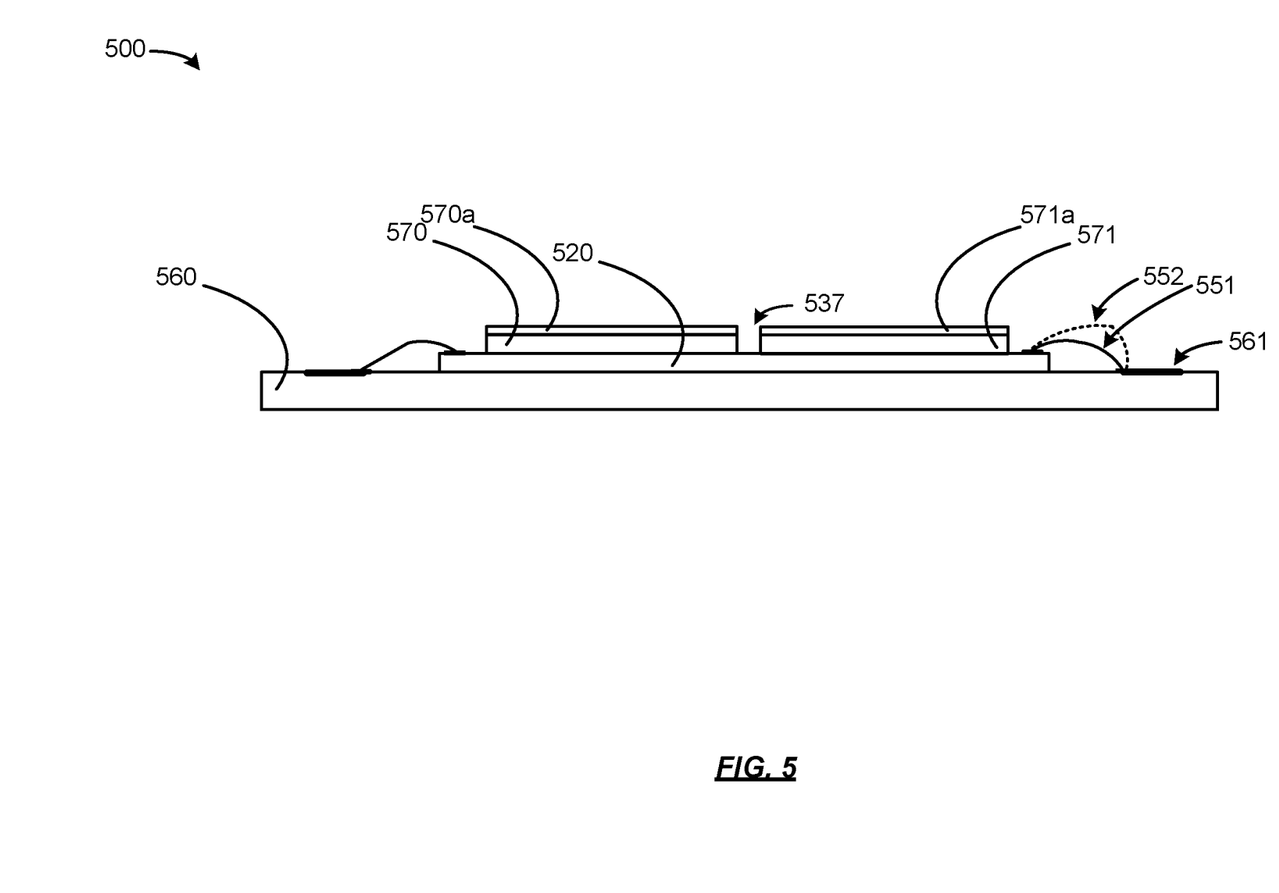
FIG. 5 illustrates a heterogeneously anti-tamper shielded integrated circuit assembly.

FIG. 5 illustrates a heterogeneously anti-tamper shielded integrated circuit assembly. In FIG. 5, assembly 500 comprises active integrated circuit die 520, packaging substrate 560, first shield die 570, second shield die 571, and wire bonds 551-552. Active die 520 includes I/O pads (not shown in FIG. 5.) Substrate 560 includes substrate pads 561-562. First shield die 570 includes anti-tamper layer 570a. Second shield die 571 includes anti-tamper layer 571a.

In FIG. 5, active die 520 is packaged on top of substrate 560. First shield die 570 is packaged on top of the left-hand portion of active die 520. Second shield die 571 is packaged on top of the righthand portion of active die 520. A gap 537 is disposed between first shield die 570 and second shield die 571. In an embodiment, first shield die 570 and second shield die 571 are dimensioned and positioned to expose the I/O pads of active die 520 so bonding wires 551-552 may be connected to active die 520. In an embodiment, bonding wires 551-552 respectively connect the I/O pads of active die 520 to the substrate pads 561-562 of substrate 560.

First shield die 570 and second shield die 571 may be packaged (bonded) to active die 520 such that the backside (bottom) oxide layers of shield dies 570-571 become chemically bonded (e.g., oxide-to-oxide) to the top oxide layer of active die 520. First shield die 570 and second shield die 571 may be packaged (bonded) to active die 520 using a bonding process that does not require processing temperatures that may damage the active circuitry of active die 520 (e.g., high temperature annealing that is greater than 170° C.) For example, first shield die 570 and second shield die 571 may be bonded to active die 520 by one or more processes described in U.S. Pat. No. 6,902,987 to Tong et al., titled "METHOD FOR LOW TEMPERATURE BONDING AND BONDED STRUCTURE". Once a bond is formed between the bottom oxide of both the first shield die 570 and the second shield die 571 to the top (active side) side of active die 520, removal of one or both of first shield die 570 and second shield die 571 without damaging the active circuitry of active die 520 is difficult or impossible.

In an embodiment, anti-tamper layers 570a-571a of first shield die 570 and second shield die 571 comprise a hard (relative to Si or SiO$_2$) material. Anti-tamper layers 570a-571a may be, for example, boron-nitride, micro-crystalline diamond, nano-crystalline diamond, diamond like carbon (DLC), etc. In an embodiment, anti-tamper layers 570a-571a may not be removed, dissolved, etc. without using a process that would damage at least a portion of the active layers of active die 520.

In an embodiment, the material used for anti-tamper layer 570a is different from the material used for anti-tamper layer 571a. In addition or alternative to the material being different, anti-tamper layer 570a might have appreciably different thickness than anti-tamper layer 571a. In this manner, it may require two (or more) processes to remove anti-tamper layer 570a and anti-tamper layer 571a rather than a single process to remove only one type of anti-tamper material of uniform thickness. By increasing the number of processes required to remove the anti-tamper layers, the difficulty of removing and/or delayering to reverse engineer assembly 500 is increased. Furthermore, gap 537 exposes more of active die 520 to the harsh requirements (e.g., temperature, acidity, chemical reactions, etc.) required to remove anti-tamper layer remove anti-tamper layer 570a and anti-tamper layer 571a. This increases the likelihood the active circuitry of active die 520 will be damaged. In particular, for example, a part of an anti-tampering metallization pattern that is part of active die 520 may be removed.

In the Figures, anti-tamper layers 170a, 270a, 271a, 370a, 470a, 570a, and 571a are shown as a single uniform layer. This is but one example used to simplify the illustration and associated discussion. It should be understood that anti-tamper layers 170a, 270a, 271a, 370a, 470a, 570a, and 571a may be non-uniform (e.g., including intentionally formed irregularities) and/or comprise multiple layers. These multiple layers may include different materials with different properties (e.g., hardness, melting point, resistance to certain chemicals, etc.). In addition, the one or more layers of layers 170a, 270a, 271a, 370a, 470a, 570a, and 571a may be patterned. These patterns and irregularities may be, for example, random or pseudo random shapes or thicknesses. The patterns may also be selected to make it more difficult to remove a layers 170a, 270a, 271a, 370a, 470a, 570a, and 571a from a shield die without also damaging the active circuitry of the protected (active) die. For example, certain shapes, geometries, spacings and or thicknesses may etch at different rates than others.

Figure 6:
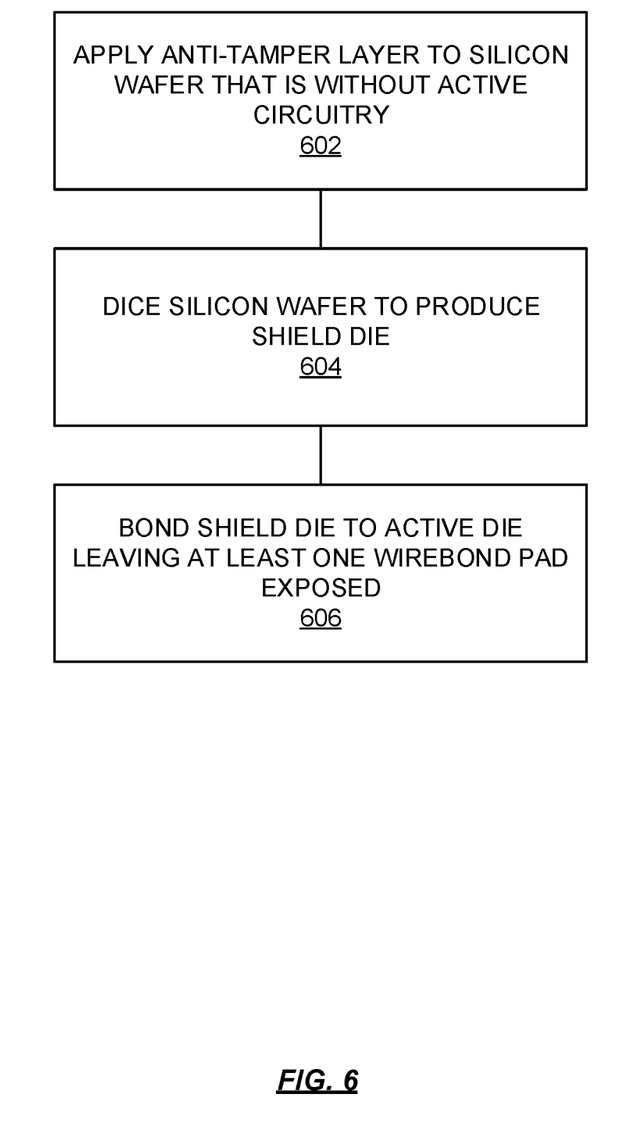
FIG. 6 is a flowchart illustrating a method of anti-tamper shielding an integrated circuit.

FIG. 6 is a flowchart illustrating a method of anti-tamper shielding an integrated circuit. The steps illustrated in FIG. 6 may be used in fabricating assembly 100, assembly 200, assembly 300, assembly 400, assembly 500, and/or their components. An anti-tampering layer is applied to a silicon wafer that is without active circuitry (602). For example, an anti-tamper layer 170a may be applied or chemically generated (e.g., by oxidation, deposition, other chemical, and/or mechanical process) on the top of a silicon wafer. Note that because there need not be any active circuitry on this silicon wafer, high temperature materials and deposition techniques (e.g., plasma CVD) can be readily used.

The wafer is diced to produce shield die (604). For example, shield die 170 may be produced by dicing a wafer that has an anti-tamper layer 170a. The shield die 170 may be sized such that it may be positioned such that wirebond pads along one or more edges of the active die will remain exposed after being bonded to an active die 120.

The shield die is bonded to the active die (e.g., using a die-to-wafer bonding technique) leaving at least one I/O pad exposed (606). For example, shield die 170 may be bonded to active die 120 in a position that leaves one or more of I/O pads 131-132 exposed. When one or more of I/O pads 131-132 are exposed, bonding wires may be connected to active die 120. In an embodiment, bonding wires 151-152 may respectively connect the I/O pads 131-132 of active die 120 to the substrate pads 161-162 of a substrate 160. Note that in other embodiments, other die-to-package attachment techniques other than traditional wirebonds may be used.

Figure 7:
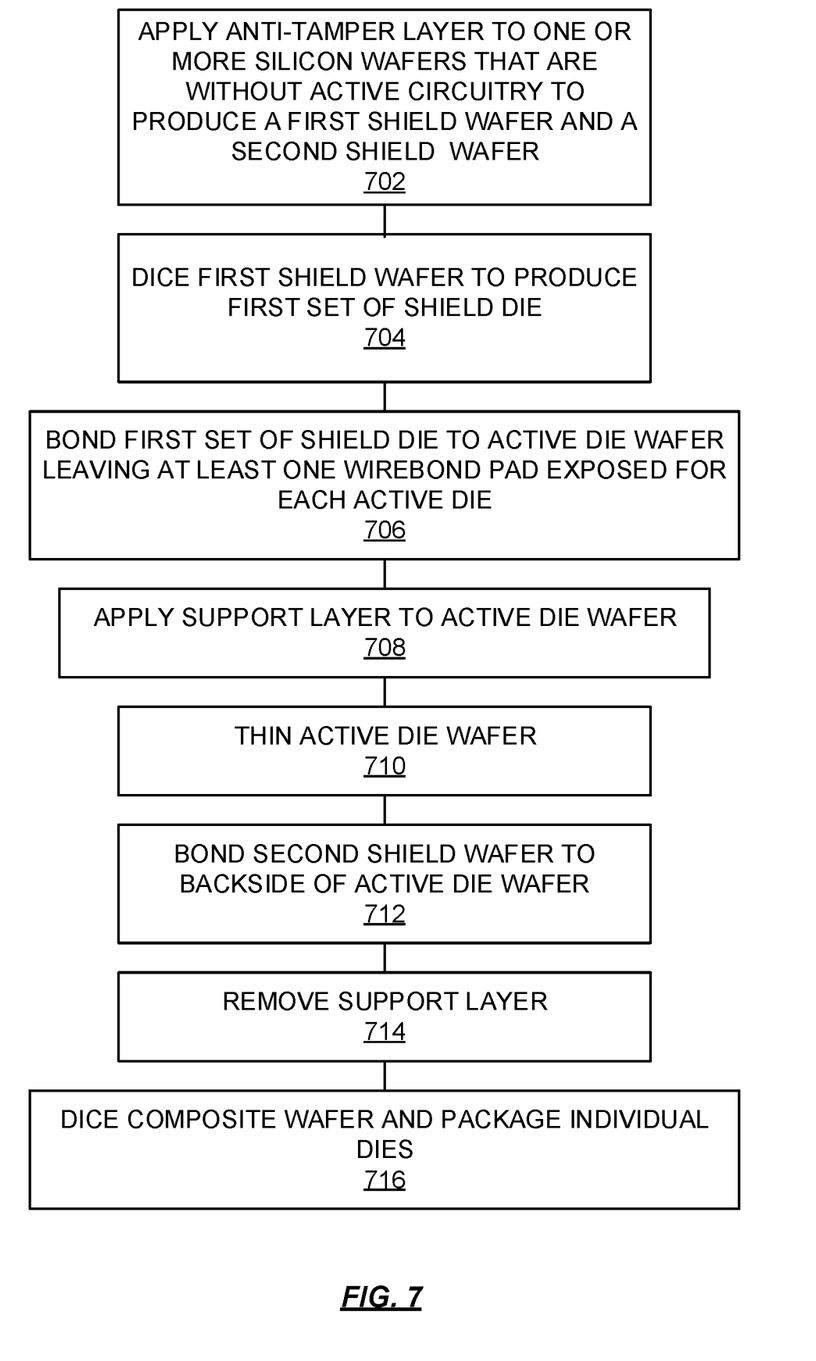
FIG. 7 is a flowchart illustrating a two-sided method of anti-tamper shielding an integrated circuit.

FIG. 7 is a flowchart illustrating a two-sided method of anti-tamper shielding an integrated circuit. The steps illustrated in FIG. 5 may be used in fabricating assembly 100, assembly 200, assembly 400, and/or their components. An anti-tampering layer is applied to one or more silicon wafers that are without active circuitry to produce a first shield wafer and a second shield wafer (702). For example, an anti-tamper layer 270a and/or 271a may be applied or chemically generated (e.g., by oxidation, deposition, other chemical, and/or mechanical process) on the top of at least one silicon wafer.

The first shield wafer is diced to produce a first set of shield die (704). For example, a shield wafer with anti-tamper layer 271a may be diced to produce a set of top shield die 270. The first set of shield die are bonded to an active die wafer (e.g., using a die-to-wafer bonding technique) leaving at least one wirebond pad exposed for each active die (706). For example, top shield die 270 may be bonded to active die 220 while active die 220 are still in wafer form. Top shield die 270 may be positioned such that at least one wirebond pad of active die 220 remains exposed.

A support layer is then applied to the active die while still in wafer form (708). For example, a temporary support wafer may be applied over the bonded shield dies 270 and active dies 220. This temporary support layer may provide mechanical support for subsequent processing steps. This temporary support layer may cover exposed wirebond pads.

The active die wafer can then be thinned (710). For example, the backside of the wafer holding the bonded shield dies 270 and active dies 220 may be thinned. The backside of the wafer holding the bonded shield dies 270 and active dies 220 may be thinned by, for example, by etching and/or chemical-mechanical polishing. The backside of the wafer holding the bonded shield dies 270 and active dies 220 may be thinned by, for example, an amount that does not damage the active circuitry of active dies 220.

A second shield wafer is bonded (e.g., using wafer-to-wafer bonding) to the backside of the active die wafer (712). For example, a second shield wafer having a second anti-tamper layer 271a may be bonded to the thinned wafer holding shield dies 270 and active dies 220.

The support layer is removed (714). For example, the temporary support layer covering shield dies 270 and active dies 220 that provided mechanical support for subsequent processing steps may be removed to re-expose the wirebond pads on active dies 220.

The composite wafer is dices and individual dies are packaged (716). For example, the wafer holding shield dies 270 attached to active dies 220 may be diced to produce individual dies that have anti-tamper shields 270a-271a on two sides of an active integrated circuit 220.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of assembly 100, assembly 200, assembly 300, assembly 400, and/or assembly 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
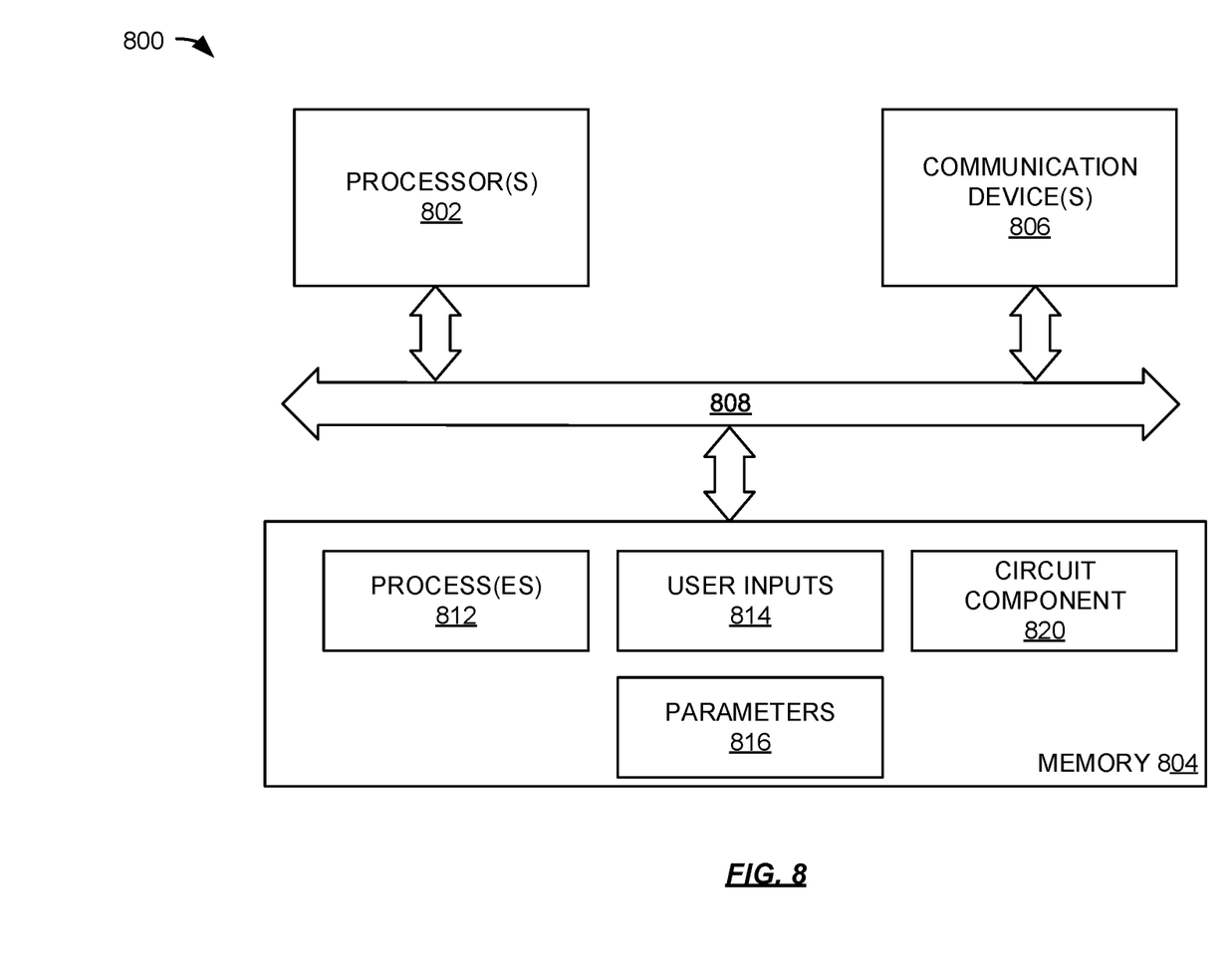
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of assembly 100, assembly 200, assembly 300, assembly 400, and/or assembly 500, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1

An electronic assembly, comprising: a substrate; an active integrated circuit die having first and second opposing sides, the first side of the active integrated circuit die including active circuitry, the second side of the active integrated circuit die mounted to the substrate; and, a first shield die having first and second opposing sides, the first side of the first shield die comprising a first high-temperature anti-tamper layer, the second side of the first shield die bonded to the first side of the active integrated circuit die.

Example 2

The assembly of example 1, wherein the active circuitry includes first bond pads for wire bonding connections to second bond pads disposed on the substrate, the second side of the first shield die not overlapping all of the first bond pads.

Example 3

The assembly of example 1, wherein the first high-temperature anti-tamper layer is not removable using a process that heats the assembly to less than 350 degrees centigrade.

Example 4

The assembly of example 1, wherein the first side of the active integrated circuit die includes an anti-tamper metallization pattern coupled to the active circuitry.

Example 5

The assembly of example 1, wherein the second side of the first shield die bonded is to the first side of the active integrated circuit die using oxide to oxide bonding.

Example 6

The assembly of example 1, wherein the second side of the first shield die is bonded to the first side of the active integrated circuit die using a process that does not heat the active integrated circuit die to a temperature greater than 170 degrees centigrade.

Example 7

The assembly of example 1, further comprising: a second shield die having first and second opposing sides, the first side of the second shield die comprising a second high-temperature anti-tamper layer, the second side of the second shield die bonded to the first side of the active integrated circuit die.

Example 8

The assembly of example 7, wherein the first high-temperature anti-tamper layer and the second high-temperature anti-tamper layer are composed of different materials.

Example 9

An electronic assembly, comprising: an active integrated circuit die comprising active circuitry disposed on a first side of the active integrated circuit die, the active integrated circuit die having a second side of the active integrated circuit die opposite the first side of the active integrated circuit die; a first shield die having first and second opposing sides, the first side of the first shield die comprising a first high-temperature anti-tamper layer, the second side of the first shield die bonded to the first side of the active integrated circuit die; and, a second shield die having first and second opposing sides, the first side of the second shield die comprising a second high-temperature anti-tamper layer, the second side of the second shield die bonded to the second side of the active integrated circuit die.

Example 10

The assembly of example 9, further comprising: a substrate, the first side of the second shield die attached to the substrate.

Example 11

The assembly of example 10, wherein the active circuitry includes first bond pads for wire bonding connections to second bond pads disposed on the substrate, the second side of the first shield die not overlapping all of the first bond pads.

Example 12

The assembly of example 11, wherein the first high-temperature anti-tamper layer has a melting point that exceeds 350 degrees centigrade.

Example 13

The assembly of example 11, wherein the second high-temperature anti-tamper layer has a melting point that exceeds 350 degrees centigrade.

Example 14

The assembly of example 8, wherein the second side of the first shield die is bonded to the first side of the active integrated circuit die, and the second side of the second shield die is bonded to the second side of the active integrated circuit die using a process that does not heat the active integrated circuit die to a temperature greater than 170 degrees centigrade.

Example 15

The assembly of example 8, further comprising: a third shield die having first and second opposing sides, the first side of the third shield die comprising a third high-temperature anti-tamper layer, the second side of the third shield die bonded to the first side of the active integrated circuit die.

Example 16

The assembly of example 8, further comprising: a third shield die having first and second opposing sides, the first side of the third shield die comprising a third high-temperature anti-tamper layer, the second side of the third shield die bonded to the second side of the active integrated circuit die.

Example 17

An electronic assembly, comprising: an active integrated circuit die comprising a first majority silicon substrate, the active integrated circuit also die comprising active circuitry disposed on a first side of the active integrated circuit die, the active integrated circuit die having a second side of the active integrated circuit die opposite the first side of the active integrated circuit die; and, a first shield die comprising a second majority silicon substrate and having first and second opposing sides, the first side of the first shield die comprising a first high-temperature anti-tamper layer, the second side of the first shield die bonded to the first side of the active integrated circuit die.

Example 18

The assembly of example 17, wherein the active circuitry includes first bond pads for wire bonding connections and the second side of the first shield die not overlapping all of the first bond pads.

Example 19

The assembly of example 17, further comprising: a second shield die having first and second opposing sides, the first side of the second shield die comprising a second high-temperature anti-tamper layer, the second side of the second shield die bonded to the second side of the active integrated circuit die.

Example 20

The assembly of example 17, further comprising: a second shield die having first and second opposing sides, the first side of the second shield die comprising a second high-temperature anti-tamper layer, the second side of the second shield die bonded to the first side of the active integrated circuit die.

Example 21

The assembly of example 17, further comprising: a substrate, the first side of the first shield die attached to the substrate.

Example 22

The assembly of example 21, wherein the active circuitry includes first bond pads for wire bonding connections to second bond pads disposed on the substrate, the second side of the first shield die not overlapping all of the first bond pads.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic assembly, comprising:
a substrate;
an active integrated circuit die having first and second opposing sides, the first side of the active integrated circuit die including active circuitry, the second side of the active integrated circuit die mounted to the substrate; and,
a first shield die with no active circuits having first and second opposing sides, the first side of the first shield die comprising an anti-tamper layer, the second side of the first shield die bonded to the first side of the active integrated circuit die.

2. The assembly of claim 1, wherein the active circuitry includes first bond pads for wire bonding connections to second bond pads disposed on the substrate, the second side of the first shield die not overlapping all of the first bond pads.

3. The assembly of claim 1, wherein the first high-temperature anti-tamper layer is not removable using a process that heats the assembly to less than 350 degrees centigrade.

4. The assembly of claim 1, wherein the first side of the active integrated circuit die includes an anti-tamper metallization pattern coupled to the active circuitry.

5. The assembly of claim 1, wherein the second side of the first shield die bonded is to the first side of the active integrated circuit die using oxide to oxide bonding.

6. The assembly of claim 1, wherein the second side of the first shield die is bonded to the first side of the active integrated circuit die using a process that does not heat the active integrated circuit die to a temperature greater than 170 degrees centigrade.

7. An electronic assembly, comprising:
an active integrated circuit die comprising active circuitry disposed on a first side of the active integrated circuit die, the active integrated circuit die having a second side of the active integrated circuit die opposite the first side of the active integrated circuit die; and,
a first shield die having first and second opposing sides, the first side of the first shield die comprising a first high-temperature anti-tamper layer, the second side of the first shield die bonded to the first side of the active integrated circuit die.

8. The assembly of claim 7, further comprising:
a substrate, the second side of the active integrated circuit die attached to the substrate.

9. The assembly of claim 8, wherein the active circuitry includes first bond pads for wire bonding connections to second bond pads disposed on the substrate, the second side of the first shield die not overlapping all of the first bond pads.

10. The assembly of claim 9, wherein the first high-temperature anti-tamper layer has a melting point that exceeds 350 degrees centigrade.

11. The assembly of claim 7, wherein the second side of the first shield die is bonded to the first side of the active integrated circuit die using a process that does not heat the active integrated circuit die to a temperature greater than 170 degrees centigrade.

12. An electronic assembly, comprising:
an active integrated circuit die comprising a first majority silicon substrate, the active integrated circuit also die comprising active circuitry disposed on a first side of the active integrated circuit die, the active integrated circuit die having a second side of the active integrated circuit die opposite the first side of the active integrated circuit die; and,
a first shield die comprising a second majority silicon substrate and having first and second opposing sides, the first side of the first shield die comprising a first high-temperature anti-tamper layer, the second side of the first shield die bonded to the first side of the active integrated circuit die.

13. The assembly of claim 12, wherein the active circuitry includes first bond pads for wire bonding connections and the second side of the first shield die not overlapping all of the first bond pads.

14. The assembly of claim 12, further comprising:
a substrate, the second side of the active integrated circuit die attached to the substrate.

15. The assembly of claim 14, wherein the active circuitry includes first bond pads for wire bonding connections to second bond pads disposed on the substrate, the second side of the first shield die not overlapping all of the first bond pads.

* * * * *